(12) United States Patent
Srinivasan et al.

(10) Patent No.: US 12,671,460 B2
(45) Date of Patent: Jun. 30, 2026

(54) CONFIGURABLE TRANSMIT-RECEIVE SWITCH FOR A TRANSCEIVER

(71) Applicant: Silicon Laboratories Inc., Austin, TX (US)

(72) Inventors: Rangakrishnan Srinivasan, Austin, TX (US); Mustafa Koroglu, Austin, TX (US); Henry Singor, Austin, TX (US); Yu Su, Austin, TX (US); Abdulkerim Coban, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 252 days.

(21) Appl. No.: 18/619,402

(22) Filed: Mar. 28, 2024

(65) Prior Publication Data

US 2025/0309937 A1 Oct. 2, 2025

(51) Int. Cl.
| | |
|---|---|
| *H04B 1/48* | (2006.01) |
| *H02H 9/04* | (2006.01) |
| *H03F 3/24* | (2006.01) |
| *H04B 1/00* | (2006.01) |

(52) U.S. Cl.
CPC .............. *H04B 1/48* (2013.01); *H02H 9/046* (2013.01); *H03F 3/245* (2013.01); *H04B 1/006* (2013.01); *H03F 2200/294* (2013.01); *H03F 2200/451* (2013.01)

(58) Field of Classification Search
CPC ........... H04B 1/48; H04B 1/006; H03F 3/245; H03F 200/294; H03F 200/451; H02H 9/046
See application file for complete search history.

(56) References Cited

U.S. PATENT DOCUMENTS

| | | | |
|---|---|---|---|
| 5,095,533 | A | 3/1992 | Loper et al. |
| 5,734,683 | A | 3/1998 | Hulkko et al. |
| 5,777,494 | A | 7/1998 | Takahashi |
| 6,195,399 | B1 | 2/2001 | Dent et al. |
| 6,735,260 | B1 | 5/2004 | Eliezer et al. |
| 6,771,720 | B1 | 8/2004 | Yang et al. |

(Continued)

FOREIGN PATENT DOCUMENTS

WO 2013130486 A1 9/2013

OTHER PUBLICATIONS

U.S. Appl. No. 18/539,468, filed Dec. 14, 2023, by Rangakrishnan Srinivasan et al., entitled Gain Contol To Optimize Sensitivity and Blocking Performance, 33 pgs.

*Primary Examiner* — Brenda H Pham
(74) *Attorney, Agent, or Firm* — Trop, Pruner & Hu, P.C.

(57) ABSTRACT

In one embodiment, an apparatus includes: a receiver pad to receive an incoming radio frequency (RF) signal; a first inductor coupled to the receiver pad; a second inductor coupled to the first inductor at an inter-inductor node; a first electrostatic discharge (ESD) circuit coupled to the inter-inductor node; a second ESD circuit coupled to the second inductor; a low noise amplifier (LNA) coupled to the second inductor to receive and amplify the incoming RF signal; a transmit-receive (TR) switch coupled to the LNA, where in a receive mode, the TR switch is to enable the LNA to receive the incoming RF signal; a transmit pad to output an outgoing RF signal; and a power amplifier (PA) coupled to the transmit pad, where in a transmit mode, the TR switch is to decouple the LNA.

20 Claims, 5 Drawing Sheets

(56) References Cited

U.S. PATENT DOCUMENTS

| | | | |
|---|---|---|---|
| 7,212,798 | B1 | 5/2007 | Adams et al. |
| 8,180,308 | B1 | 5/2012 | Neng et al. |
| 8,346,202 | B2 | 1/2013 | Coban et al. |
| 8,554,136 | B2 | 10/2013 | McCormack |
| 8,811,526 | B2 | 8/2014 | McCormack et al. |
| 8,912,785 | B2 | 12/2014 | Horvath |
| 9,172,344 | B2 | 10/2015 | Green et al. |
| 9,203,452 | B2 | 12/2015 | Li et al. |
| 9,322,904 | B2 | 4/2016 | McCormack et al. |
| 9,379,450 | B2 | 6/2016 | Kyles et al. |
| 9,407,311 | B2 | 8/2016 | McCormack et al. |
| 9,426,660 | B2 | 8/2016 | McCormack et al. |
| 9,444,523 | B2 | 9/2016 | McCormack et al. |
| 9,515,365 | B2 | 12/2016 | McCormack et al. |
| 9,515,859 | B2 | 12/2016 | McCormack et al. |
| 9,736,790 | B1 | 8/2017 | Haub et al. |
| 9,948,347 | B2 | 4/2018 | Milenkovic |
| 10,469,112 | B2 | 11/2019 | Coban |
| 2004/0190650 | A1 | 9/2004 | Khorram et al. |
| 2004/0196017 | A1 | 10/2004 | Sutardja et al. |
| 2005/0186910 | A1 | 8/2005 | Moorti et al. |
| 2005/0186917 | A1 | 8/2005 | Rofougaran et al. |
| 2007/0248192 | A1 | 10/2007 | Brunsch et al. |
| 2008/0160945 | A1 | 7/2008 | Crinon et al. |
| 2010/0026547 | A1 | 2/2010 | Weissman et al. |
| 2010/0153589 | A1 | 6/2010 | Maroni et al. |
| 2010/0172450 | A1 | 7/2010 | Komaili et al. |
| 2010/0246714 | A1 | 9/2010 | Yang et al. |
| 2011/0009080 | A1 | 1/2011 | Seendripu et al. |
| 2011/0098009 | A1* | 4/2011 | Marholev ................ H04B 5/48 |
| | | | 455/78 |
| 2011/0279184 | A1* | 11/2011 | Chan ...................... H03F 1/347 |
| | | | 330/277 |
| 2012/0121043 | A1 | 5/2012 | Wambacq |

| | | | |
|---|---|---|---|
| 2012/0249366 | A1 | 10/2012 | Pozgay et al. |
| 2012/0263244 | A1 | 10/2012 | Kyles et al. |
| 2012/0307932 | A1 | 12/2012 | McCormack et al. |
| 2012/0319774 | A1 | 12/2012 | Ibrahim et al. |
| 2012/0326904 | A1 | 12/2012 | Jensen et al. |
| 2013/0070817 | A1 | 3/2013 | McCormack et al. |
| 2013/0195215 | A1 | 8/2013 | Manglani et al. |
| 2013/0196598 | A1 | 8/2013 | McCormack et al. |
| 2013/0257670 | A1 | 10/2013 | Sovero et al. |
| 2013/0316653 | A1 | 11/2013 | Kyles et al. |
| 2014/0016723 | A1 | 1/2014 | Mu et al. |
| 2014/0160939 | A1 | 6/2014 | Arad et al. |
| 2014/0167862 | A1* | 6/2014 | Khatri ...................... H03F 1/52 |
| | | | 330/298 |
| 2014/0273856 | A1 | 9/2014 | Kyles et al. |
| 2014/0273894 | A1 | 9/2014 | McCormack et al. |
| 2014/0281534 | A1 | 9/2014 | McCormack et al. |
| 2014/0286643 | A1 | 9/2014 | George et al. |
| 2014/0341232 | A1 | 11/2014 | McCormack et al. |
| 2015/0031320 | A1 | 1/2015 | Li et al. |
| 2015/0048959 | A1 | 2/2015 | Zhu |
| 2015/0065069 | A1 | 3/2015 | McCormack et al. |
| 2015/0094002 | A1 | 4/2015 | Kyles et al. |
| 2015/0131683 | A1 | 5/2015 | De Ruijter et al. |
| 2015/0381228 | A1 | 12/2015 | Milenkovic |
| 2016/0036495 | A1 | 2/2016 | McCormack et al. |
| 2016/0064827 | A1 | 3/2016 | Kyles et al. |
| 2016/0344484 | A1 | 11/2016 | Nakamura et al. |
| 2016/0380676 | A1 | 12/2016 | McCormack et al. |
| 2017/0046299 | A1 | 2/2017 | Isaac et al. |
| 2017/0086281 | A1 | 3/2017 | Avrahamy |
| 2017/0373709 | A1 | 12/2017 | Kondo et al. |
| 2018/0041235 | A1 | 2/2018 | Kyles et al. |
| 2018/0309602 | A1 | 10/2018 | Zheng et al. |
| 2019/0334539 | A1* | 10/2019 | Gathman ................. H04B 1/28 |
| 2019/0356278 | A1* | 11/2019 | Smith, Jr. .............. H03F 3/213 |
| 2019/0379329 | A1* | 12/2019 | Kwok ................... H03F 1/0205 |

* cited by examiner

CONFIGURABLE TRANSMIT-RECEIVE SWITCH FOR A TRANSCEIVER

BACKGROUND

Transceivers include both receive and transmit circuitry, and are prevalent in wireless devices. The transmit and receive circuitry may share certain components coupled to the transceiver including an antenna and a diplexer, which routes signals to the appropriate circuit. Another component used with a transceiver is a transmit-receive switch to enable a given one of transmitter and receiver to be active at a time.

Often, the transmit-receive antenna is provided as an external switch, typically implemented on a circuit board and coupled to an integrated circuit including the transceiver, also implemented on the circuit board. This external switch can increase bill of material costs. Replacing the external switch with an internal switch may reduce the cost, but adversely affects a receiver noise figure (when the transmitter is off) and impacts transmitter performance (when the receiver is off), among other issues.

SUMMARY OF THE INVENTION

In one aspect, an apparatus includes: a receiver pad to receive an incoming radio frequency (RF) signal captured by an antenna; a first inductor coupled to the receiver pad; a second inductor coupled to the first inductor at an inter-inductor node; a first electrostatic discharge (ESD) circuit coupled to the inter-inductor node; a second ESD circuit coupled to the second inductor; a low noise amplifier (LNA) coupled to the second inductor to receive and amplify the incoming RF signal; a transmit-receive (TR) switch coupled to the LNA, where in a receive mode, the TR switch is to enable the LNA to receive the incoming RF signal; a transmit pad to output an outgoing RF signal to the antenna; and a power amplifier (PA) coupled to the transmit pad, wherein in a transmit mode, the TR switch is to decouple the LNA.

In an implementation, the apparatus further comprises a unitary loop structure formed on a semiconductor die, the unitary loop structure comprising the first inductor and the second inductor. The first inductor may have a greater inductance than the second inductor. The receiver pad is to couple to a matching circuit coupled to the semiconductor die, the first inductance and the second inductance to match an inductance of the matching circuit.

In an implementation, the first ESD circuit comprises: a first plurality of diodes coupled between the inter-inductor node and a reference voltage node with a first polarity, the first plurality of diodes series coupled; and a second plurality of diodes coupled between the inter-inductor node and the reference voltage node with a second polarity, the second plurality of diodes series coupled, the first plurality of diodes in parallel with the second plurality of diodes. The second ESD circuit may include: a third plurality of diodes coupled between the second inductor and the reference voltage node with a first polarity, the third plurality of diodes parallel coupled; and a fourth plurality of diodes coupled between the second inductor and the reference voltage node with a second polarity, the fourth plurality of diodes parallel coupled, the third plurality of diodes in parallel with the fourth plurality of diodes.

In an implementation, when the apparatus is configured in a first wireless device having an external TR switch, at least some of the first plurality of diodes and the second plurality of diodes are configured to be unconnected. When the apparatus is configured in the first wireless device having the external TR switch, the first ESD circuit is to couple between the receiver pad and the reference voltage node, and a first conductor that couples the first ESD circuit to the inter-inductor node is disconnected.

In an implementation, the apparatus is to couple to a first matching circuit via the receive pad and to a second matching circuit via the transmit pad, the first and second matching circuits to couple directly to a diplexer without an external TR switch therebetween. The apparatus is to couple to a matching circuit via the receive pad and the transmit pad, the matching circuit to couple directly to a diplexer without an external TR switch therebetween.

In another aspect, an integrated circuit includes at least one semiconductor die that in turn includes: a receiver pad to receive an incoming RF signal captured by an antenna; a first inductor coupled to the receiver pad; a second inductor coupled to the first inductor at an inter-inductor node; a first ESD circuit coupled to the inter-inductor node; a second ESD circuit coupled to the second inductor; a LNA coupled to the second inductor to receive and amplify the incoming RF signal; a TR switch coupled to the LNA; a transmit pad to output an outgoing RF signal to the antenna during a transmit mode; and a PA coupled to the transmit pad to amplify and output the outgoing RF signal to the transmit pad. When the integrated circuit is implemented in a wireless device having an external TR switch coupled to the integrated circuit, the TR switch is controlled to be in an opened state. When the integrated circuit is implemented in a wireless device not having an external TR switch coupled to the integrated circuit, the TR switch is controlled be in the opened state during a receive mode in which the LNA is to receive the incoming RF signal and in a closed state during a transmit mode.

In an implementation, when the integrated circuit is implemented in the wireless device having the external TR switch coupled to the integrated circuit, a first conductor that couples the first ESD circuit to the inter-inductor node is disconnected, and a second conductor that couples the first ESD circuit to the receive pad is connected.

In an implementation, the first ESD circuit comprises: a first diode stack having a first plurality of series-coupled diodes; and a second diode stack coupled in parallel with the first diode stack, the second diode stack having a second plurality of series-coupled diodes. When the integrated circuit is implemented in the wireless device having the external TR switch coupled to the integrated circuit less than all of the first plurality of series-coupled diodes and less than all of the second plurality of series-coupled diodes are connected; and when the integrated circuit is implemented in the wireless device not having the external TR switch coupled to the integrated circuit, all of the first plurality of series-coupled diodes and all of the second plurality of series-coupled diodes are connected. When the integrated circuit is implemented in a wireless device having the external TR switch coupled to the integrated circuit, the TR switch is controlled to be in a closed state during a calibration mode.

In an implementation, the second ESD circuit comprises: a third plurality of diodes coupled between the second inductor and the reference voltage node with a first polarity, the third plurality of diodes parallel coupled; and a fourth plurality of diodes coupled between the second inductor and the reference voltage node with a second polarity, the fourth plurality of diodes parallel coupled, the third plurality of diodes in parallel with the fourth plurality of diodes. When the integrated circuit is implemented in the wireless device having the external TR switch coupled to the integrated circuit, less than all of the third plurality of diodes and less than all of the fourth plurality of diodes are connected.

In yet another aspect, a system comprises: an antenna to transmit and receive RF signals; a diplexer coupled to the antenna to direct the RF signals of a first band to a first matching circuit and direct the RF signals of a second band to a second matching circuit; the first matching circuit coupled to the diplexer; the second matching circuit coupled to the diplexer; an integrated circuit coupled to the first matching circuit and the second matching circuit. The integrated circuit may include a plurality of transceivers, where a first transceiver of the plurality of transceivers comprises: a receiver pad, in a receive mode, to receive a first RF signal of the first band; a first inductor coupled to the receiver pad; a second inductor coupled to the first inductor at an inter-inductor node; a first ESD circuit coupled to the inter-inductor node; a second ESD circuit coupled to the second inductor; a LNA coupled to the second inductor to receive and amplify the first RF signal of the first band; a TR switch coupled to the LNA, where in the receive mode, the TR switch is to enable the LNA to receive the first RF signal of the first band; a transmit pad, in a transmit mode, to output a second RF signal of the first band; and a PA to receive and amplify the second RF signal of the first band, where in the transmit mode, the TR switch is to decouple the LNA.

In an implementation, the system further comprises an external TR switch coupled to the integrated circuit, where the TR switch is controlled to be in an opened state when the external TR switch is coupled to the integrated circuit.

In an implementation, the integrated circuit comprises a unitary loop structure formed on a semiconductor die, the unitary loop structure comprising the first inductor and the second inductor, wherein the first inductor has a first inductance and the second inductor has a second inductance, the first inductance greater than the second inductance, and the first ESD circuit is coupled to a tap point of the unitary loop structure.

DETAILED DESCRIPTION

In various embodiments, a multi-protocol wireless transceiver may be implemented on a single semiconductor die adapted in an integrated circuit (IC). The arrangement of this transceiver provides for a variety of options as to different use cases. These options enable the transceiver to be used in different wireless devices having different components. For example, the IC and its included multi-protocol transceiver may have an integrated transmit-receive (TR) switch. Depending upon a device in which the integrated circuit is included, this integrated TR switch may be used. Or the TR switch can be disabled in favor of an external TR switch.

Furthermore, embodiments can support a variety of different external TR switches, including standalone switches such as implemented as a Single Pole Double Throw (SPDT) switch, or as an integrated TR switch included in a front-end module (FEM) coupled to the IC.

Also, embodiments provide circuitry configured to reduce interference between transmit and receive paths, enabling improved receiver performance while at the same time providing electrostatic discharge (ESD) protection. Embodiments further can reduce the impact of high transmit power in a transmit mode on the receiver, while at the same time reducing amplifier loading of the transmitter in a receive mode. As such, embodiments provide an optimized solution for a receiver noise figure (NF) and return loss (S11), and output power capabilities in a transmit mode.

Embodiments thus provide an integrated TR switch in a transceiver having a receiver that coexists with a high output power amplifier, integrated on the same die, that can transmit signals of multiple wireless protocols, including IEEE 802.11 a/b/g/n/ax Wi-Fi signals. To support a maximum transmit output power level of between approximately 20 and 30 decibels-milliwatts (dBm). In some embodiments, there may be separate chip connections for transmit and receive via separate transmit/receive pads, which may swing at up to 7 volts peak for a 27 dBm output or higher depending on voltage standing wave ratio (VSWR) due to antenna load conditions). The ESD circuitry may be configured to be located at different points depending on whether the internal TR switch is to be used, as discussed herein. In this way, receiver (when off) loading on the transmitter along with the circuitry does not impact transmitter performance. And the dual of transmitter (when off) loading on the receiver is managed to minimize noise figure impact.

Figures 1A, 1B, 1C:
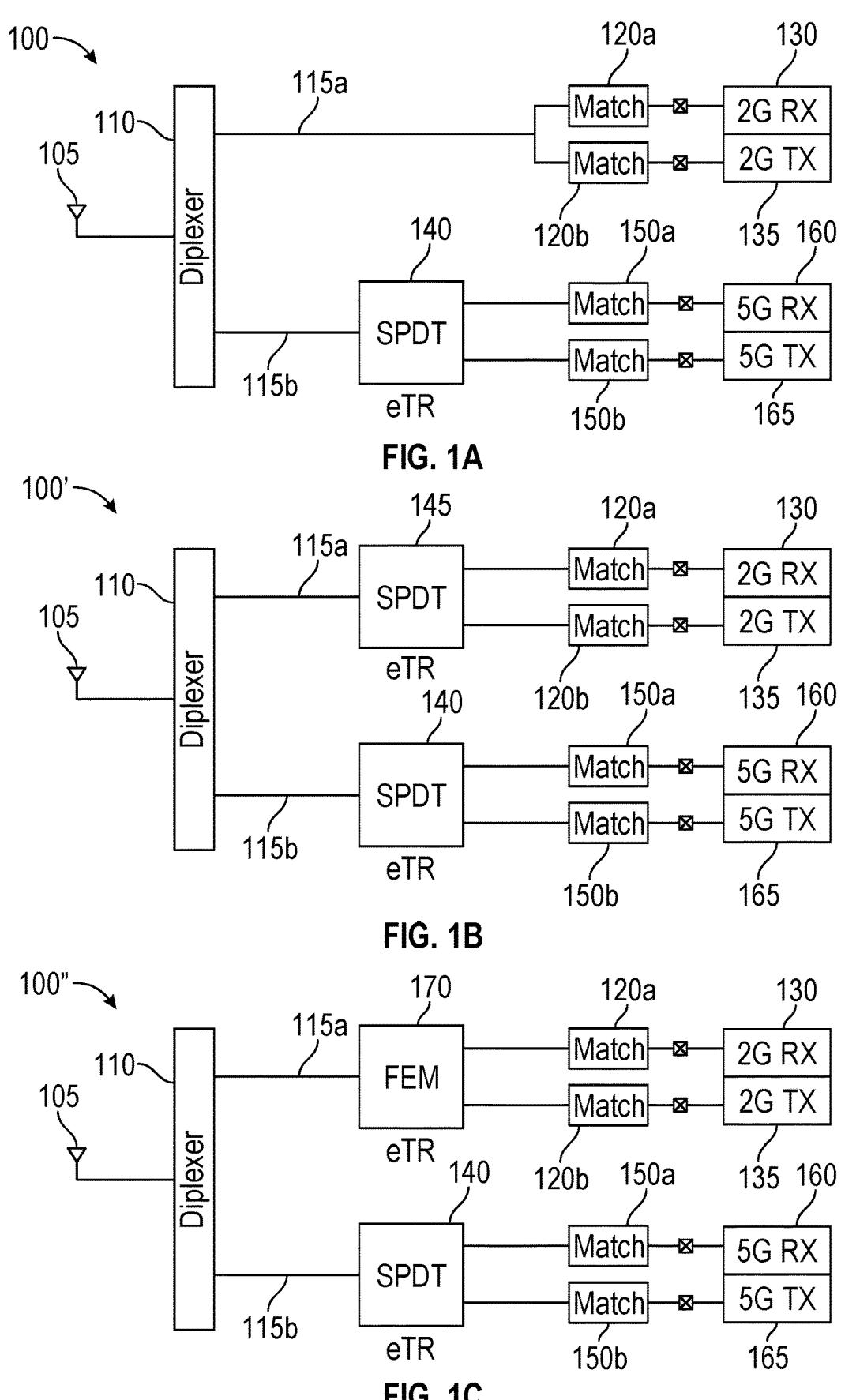
FIGS. 1A-1C are high level views of a wireless device in accordance with embodiments.

Referring now to FIG. 1A, shown is a high level view of a wireless device in accordance with an embodiment. As shown in FIG. 1A, wireless device 100 may be any type of wireless device, ranging from small Internet of Things (IoT) devices to larger devices such as smartphones, tablet computers, laptop computers, to even larger systems, such as client computer systems, wireless TVs and so forth. As illustrated, wireless device 100 includes an antenna 105 which may be a multi-band antenna that is configured to handle multiple wireless RF signals, including Wi-Fi signals and low power wireless (LPW, i.e., BLE/IEEE802.15.4) signals. Antenna 105 couples to a diplexer 110, which splits RF signals into a first path 115a and a second path 115b. As shown, first path 115a is for 2.4 gigahertz (GHz) (generically 2G) transceiver circuitry while in turn second path 115b is for 5.0 GHz (generically 5G) transceiver circuitry.

As illustrated in FIG. 1A, 2G RF signals are communicated between diplexer 110 and matching circuitry 120a,b. As will be described herein, matching circuitry 120 may be implemented with capacitors and inductors to provide impedance matching. The resulting RF signals in turn communicate onto a die of a multi-protocol transceiver integrated circuit having a receiver 130 and a transmitter 135. With this arrangement, an integrated TR switch internal to the integrated circuit enables communication with the appropriate unit and isolates the unused unit.

In second path 115b, an external TR switch is present, implemented as an SPDT switch 140 that in turn couples to matching circuitry 150a,b. As shown, each matching circuit 150 couples to a corresponding one of a 5 GHz receiver 160 and 5 GHz transmitter 165, e.g., integrated on the same semiconductor die with receiver 130 and transmitter 135. Thus In one or more embodiments, the transceiver circuitry of paths 115a,b may be implemented on a single die of the integrated circuit; of course, these separate transceivers can be located on separate die and/or ICs in other implementations.

Referring now to FIG. 1B, shown is a block diagram of a wireless device in accordance with another embodiment. In FIG. 1B, wireless device 100' may be implemented with similar components as wireless device 100 (and thus, the same enumeration is used to reference like components). However in the embodiment of FIG. 1B, note the presence of an additional SPDT 145 for first path 115*a*. Thus in this implementation, both the 2.4 GHz and 5 GHz paths include external TR switches. As will be described further herein, the internal TR switch still may be present; however, it may be disabled as a metal option. Yet in other cases, disabling of this integrated TR switch may occur by programmable configuration to improve receiver performance.

Referring now to FIG. 1C, shown is a block diagram of a wireless device in accordance with yet another embodiment. In FIG. 1C, wireless device 100" may be implemented with similar components as wireless device 100' of FIG. 1B (and thus, the same enumeration is used to reference like components). However in the embodiment of FIG. 1C, instead of a SPDT 145, a front end module (FEM) 170 (which may include a TR switch) provides coupling between diplexer 110 and matching circuits 120*a,b*. Of course although shown with these particular use cases in FIGS. 1A-1C, embodiments may be implemented in other wireless devices.

Figure 2:
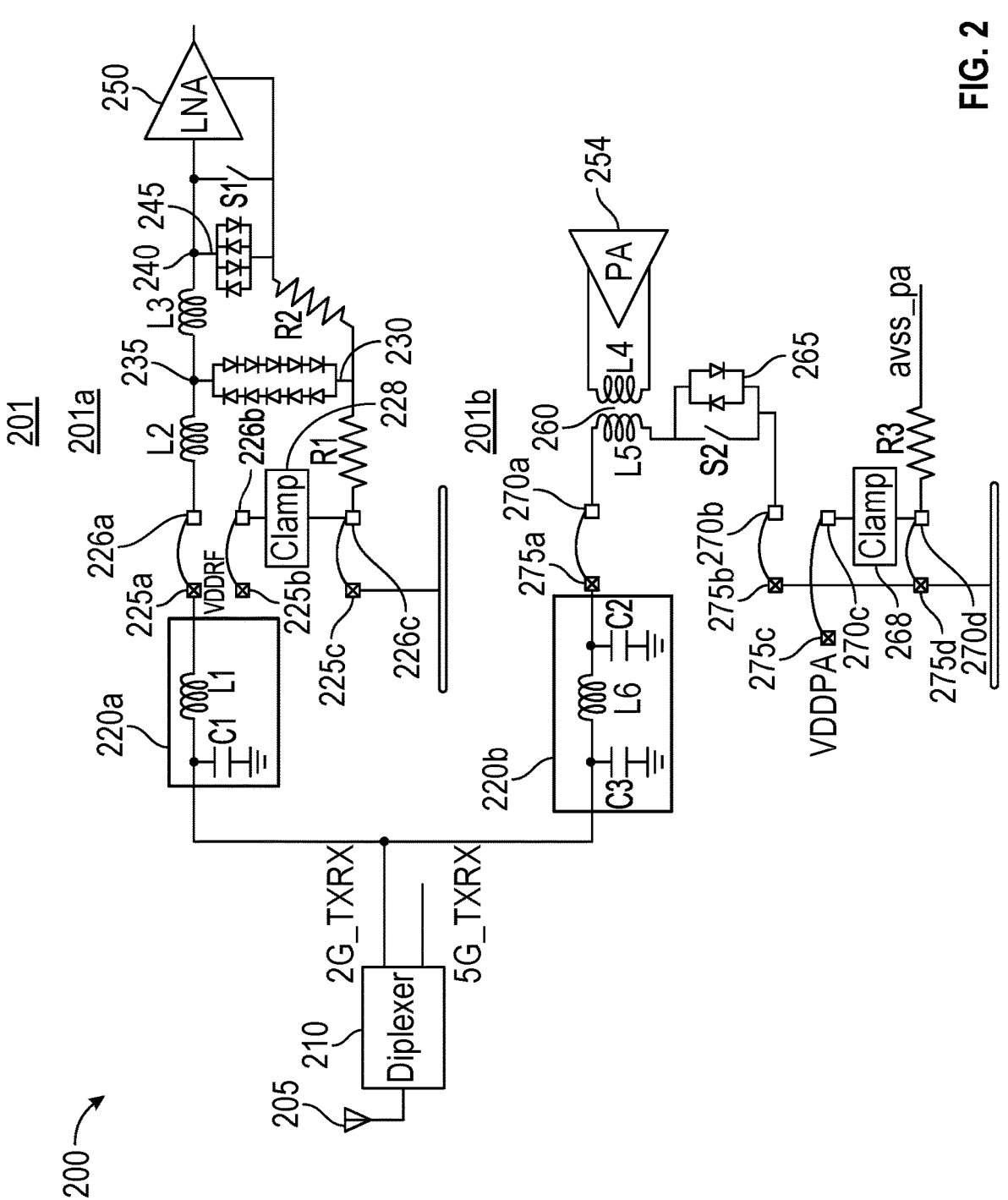
FIG. 2 is a schematic diagram of a wireless device in accordance with an embodiment.

Referring now to FIG. 2, shown is a schematic diagram of a portion of a wireless device in accordance with an embodiment. In FIG. 2, wireless device 200 is shown at a high level, including several off-chip components and on-chip circuitry, implemented as a transceiver 201, e.g., a 2.4 GHz transceiver. As illustrated, an antenna 205, namely a multi-band antenna, couples to a diplexer 210, which splits RF signals into separate paths for 2G processing and 5G processing. In the high level view shown in FIG. 2, only a 2.4 GHz RF signal processing path is illustrated.

In the receive direction, a receiver signal processing path 201*a* is present. As seen, incoming RF signals are provided to a first matching circuit 220*a*, formed of an inductor L1 and a capacitor C1 that couples between the signal processing path and a reference voltage node (e.g., a ground node). After matching, the incoming RF signal, which is single-ended, couples through a pin 225*a* to a receiver pad 226*a*. Note that as used herein, the terms "pin" and "pad" can be used interchangeably and refer to any conductive element that enables interconnection of an IC with other circuitry. To this end, note that while pin 225*a* may be external to a semiconductor die of an IC, they may be part of a package or other socket of the IC. In any case, understand that pins may couple to corresponding pads within the semiconductor die, e.g., via wire bonds as shown in FIG. 2.

The incoming RF signal couples through series-coupled inductors L2, L3, which couple at an inter-inductor node 235. In an embodiment, inductors L2, L3 may be sized in a 2:1 ratio and may provide matching with matching circuit 220*a*. This 2:1 may be selected so that the impact of an electrostatic discharge (ESD) circuit 230 (discussed below) is optimal to accomplish both reduction of transmit swings and minimal noise figure degradation. To this end, in one implementation matching circuit 220*a* may include inductor L1 having a size of 1.5 nanoHenries (nH). In turn, inductor L2, L3 may be sized with a 2:1 ratio, with L2 at 3.0 nH and L3 at 1.5 nH. Note that in one or more embodiments, these different on-chip inductors L2, L3 may be physically formed of a single loop-based inductor structure adapted on one or more metal layers of the semiconductor die.

To provide (ESD protection, ESD circuit 230 couples between inter-inductor node 235 and a reference voltage node (which may be at an LNA ground level). As illustrated, ESD circuit 230 may be implemented with two separate pluralities of oppositely coupled diodes. Although an implementation is shown in FIG. 2 with five diodes in each path, embodiments are not limited in this regard and more or fewer series-coupled diodes may be present. In an embodiment, ESD circuit 230 may couple to node 235 via a tap of the loop inductor. With this arrangement, the potentially high voltage when in transmit mode is reduced to lower voltages by the point it hits ESD circuit 230 (e.g., from 7V to 1.33V), and even lower as it proceeds to further circuitry of the receive path. This ensures that ESD circuits do not turn on to affect the non-linearity and output power of the transmitter output.

Further, as will be described below, depending upon configuration, one or more of these diodes may remain disconnected. That is, for an integrated TR implementation, the full diode stacks are coupled/enabled, while for an external TR implementation, one or more of the diodes can be disconnected/disabled.

Still referring to FIG. 2, the incoming RF signal is provided to a low noise amplifier (LNA) 250. Note further in FIG. 2 the presence of another ESD circuit 245 coupled between a node 240 and the reference voltage node. As shown, ESD circuit 245 includes parallel-connected diodes in both directions. In an embodiment, ESD circuit 230 and ESD circuit 245 may be primary ESD circuits. For example, when a human body model (HBM) event occurs, an incoming ESD event of approximately 1.3 Amperes (A) and 2 kilovolts activates ESD circuit 245 which takes all the current, and not ESD circuit 230. For a charged device model (CDM) event, an incoming ESD event of 6 A and 500V is handled by both ESD circuits 230, 245 (where each circuit may take half the current).

As discussed above in some implementations and depending upon a system in which the transceiver is implemented, one or more of these diodes may remain disconnected. However in the arrangement of FIG. 2 in which TR switch S1 is assumed to be the only TR switch of the system (i.e., no external TR switch is present), all diodes are connected.

Still referring to FIG. 2, a TR switch S1 couples between the input of LNA 250 and the receiver ground node. In a receive mode, switch S1 is open, providing for incoming RF signals to couple to LNA 250. Instead in a transmit mode, switch S1 is configured to be closed to thus isolate LNA 250. In one or more embodiments, TR switch S1 may be implemented as a metal oxide semiconductor field effect transistor (MOSFET) having a gate terminal coupled to receive a control signal, e.g., from a controller, to cause the MOSFET to be controllably opened or closed, depending on whether the device is in a receive or transmit mode. In one or more embodiments, this MOSFET may include or otherwise be associated with ESD protection, to protect the switch and or assist ESD circuit 245.

As further illustrated, additional circuitry is present in receiver signal processing path 201*a*, including resistors R1 and R2 that couple to the reference voltage node. In an implementation, these resistors may be very small, e.g., amounting to only metal routing resistance. In addition, a clamp circuit 228 couples to a pad 226*b* and a ground pad 226*c*. As shown, these pads in turn couple to corresponding pins 225*b, c*.

Still referring to FIG. 2, transceiver 201 also includes a transmit signal processing path 201*b*. In a transmit direction, outgoing RF signals are provided to a power amplifier (PA)

254 for amplification. In one or more embodiments, PA 254 may be configured to amplify outgoing RF signals to an output power level of between 20 and 30 decibels-milliwatts (dBm). As shown, PA 254 outputs the outgoing RF signal differentially. The output differential RF signal couples through a balun 260 formed of a pair of inductors L4, L5, to convert the differential RF signal to a single-ended RF signal that is output via a transmit pad 270a to a corresponding pin 275a. As illustrated, the outgoing RF signal couples through matching circuitry 220b (formed of a series inductor L6 and parallel capacitors C2, C3) and diplexer 210 and then to antenna 205. In another implementation, there may be shared matching circuitry (e.g., only matching circuit 220a is present). In such implementation, pin 275a with matching circuit 220b acting as a shared filter in both transmit and receive directions.

As further illustrated in FIG. 2, the secondary side of balun 260 couples to a switch S2 that is adapted in parallel with another ESD circuit 265. In turn, these components are coupled to a transmit RF ground pad 270b (in turn, coupled to a pin 275b). In addition, a supply voltage pin 275c and corresponding ground pin 275d couple to corresponding on-chip pads 270c,d that couple between a clamp 268. As shown, pad 270d couples to a resistor R3 (which may be implemented as a parasitic metal resistance (although some embodiments could use a physical resistor). As shown, resistor R3 couples to a ground node (e.g., avss_pa) or another transmitter associated ground node. Although shown at this high level in the embodiment of FIG. 2, many variations and alternatives are possible.

Figure 3:
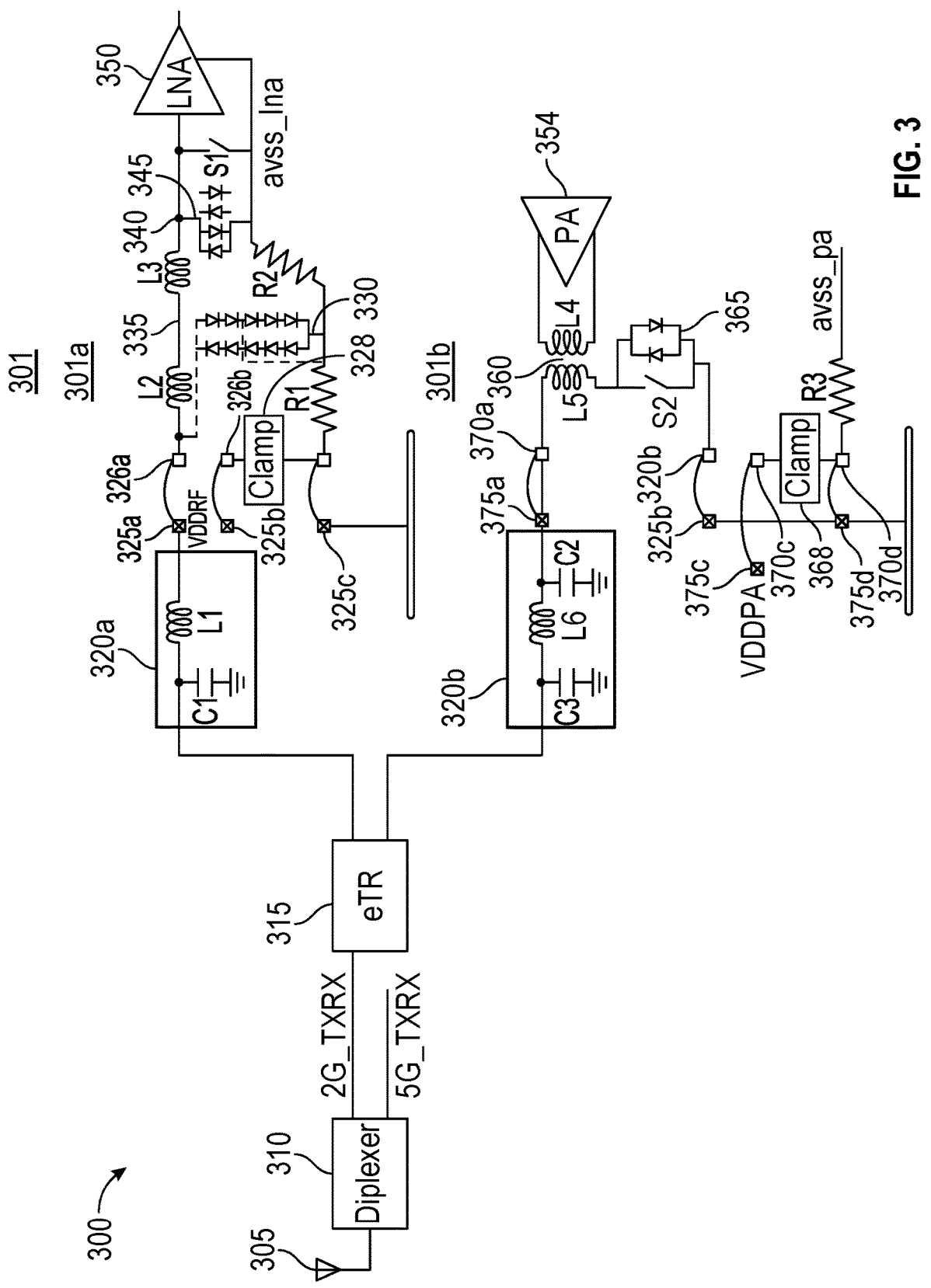
FIG. 3 is a schematic diagram of a wireless device in accordance with another embodiment.

Referring now to FIG. 3, shown is a block diagram of an apparatus in accordance with another embodiment. In the implementation of FIG. 3, a transceiver 300 may similarly be configured as transceiver 200 in FIG. 2 (and thus the same enumerations, albeit of the "300" series are used). However in this implementation, apparatus 300 includes an external TR switch 315. Thus in this use case, internal TR switch S1 is configured to be disconnected. To this end, a controller or other circuitry of transceiver 300 may cause TR switch S1 to remain in an opened position for the entirety of operation (including in both transmit and receive modes). However switch S1 may still be employed to provide improved isolation between transmitter and receiver in this configuration. For example, in a calibration operation (e.g., for adaptive digital pre-distortion (ADPD)) where transceiver 300 is in a transmit mode, the LNA is off, and switch S1, when closed can provide additional isolation (where the transmit signal output by the PA is routed to downstream receiver circuitry (e.g., a mixer).

Also note that in this implementation, first ESD circuit 330 couples directly to receiver pad 326a, rather than inter-inductor node 335. This different coupling of first ESD circuit 330 may be effected in different ways in different embodiments. As a first example, apparatus 300 can be fabricated using a different mask design than that used for fabrication of apparatus 200 of FIG. 2. Understand that different mask designs (e.g., mask sets) may be used for different manufacturing runs to provide resulting integrated circuits of different stock keeping units (SKUs) for configuration into wireless devices implementing either integrated or external TR switches.

Still referring to FIG. 3, ESD circuit 330 is directly routed to receiver pad 326a, which may be implemented using a different mask design. This metal option may be implemented as a separate mask set, where only one or two of the masks are changed, and the others stay the same, reducing overall cost. In other implementations, a single mask design is used for both arrangements shown in FIGS. 2 and 3, to effect the different coupling of ESD circuit 330.

With a metal option, different conductor routing is provided to cause ESD circuit 330 to be directly coupled to receiver pad 326a (and not to inter-inductor node 335). As an example, an ultra-thick metal (UTM) layer or a top metal layer (e.g., a M7 layer) of a semiconductor die can be provided with a conductor to couple the top of the diode stacks of ESD circuit 330 to receive pad 326a, instead of to inter-inductor node 335. In an implementation in which inter-inductor node 335 is implemented as a tap point of a unitary loop structure, this conductor instead causes the top of the diode stack to couple directly to receiver pad 326a.

In addition as further shown in FIG. 3, there are fewer connected diodes in the stacks of ESD circuit 330. For example the portions of the diode stacks below the dashed line may be unconnected in a configuration for use with an eTR switch. As also shown, second ESD circuit 345 also may have fewer diodes connected. With this configuration, for an HBM event of the same magnitude as above, ESD circuit 330 is configured to take 75% of the HBM current and ESD circuit 345 is configured to take 25% of the HBM current. For a CDM event of the same magnitude as above, ESD circuit 330 is configured to take most of the current (e.g., 5.5 A) while ESD circuit 345 is configured to take a small amount of current (e.g., 0.5 A).

In the implementation of FIG. 3, providing smaller diode stacks may be appropriate, since with an external TR switch, there is less concern for transmit swings on the internal nodes. And with the location of ESD circuit 330 coupled to pad 326a, the arrangement is optimal for noise performance (note the FIG. 2 iTR implementation does not have ESD circuit 230 coupled to pad 226a, due to the high swing at this node, as the ESD structure would turn on and affect transmit performance.

As with the above discussion, this different configuration of diodes in ESD circuits 330, 345 may be realized by using a different mask design than used for fabrication of apparatus 200. Or, the fewer number of diodes can be realized via a metal option to maintain one or more of the diodes disconnected when implemented in a wireless device having an eTR. In other aspects, the arrangement of the transceiver in FIG. 3 may be the same as discussed above in FIG. 2.

Figure 4:
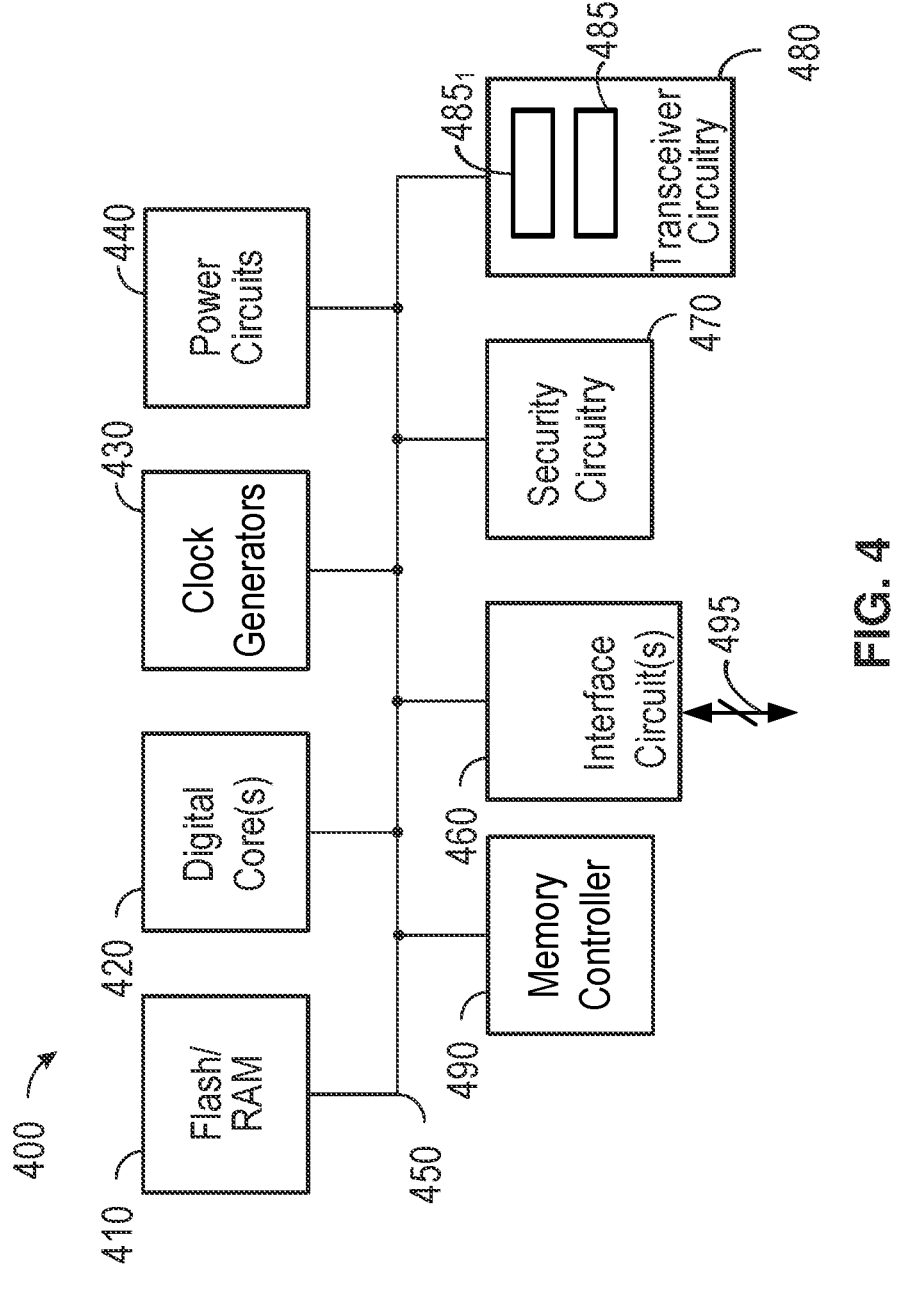
FIG. 4 is a block diagram of a representative integrated circuit that incorporates an embodiment.

Referring now to FIG. 4, shown is a block diagram of a representative integrated circuit 400 that includes an integrated TR switch and associated ESD circuitry, as described herein. In the embodiment shown in FIG. 4, integrated circuit 400 may be, e.g., a dual mode wireless transceiver that may operate according to one or more wireless protocols (e.g., WLAN and Bluetooth, among others) or other device that can be used in a variety of use cases. In one or more embodiments, the circuitry of integrated circuit 400 shown in FIG. 4 may be implemented on a single semiconductor die.

Integrated circuit 400 may be included in a range of devices including a variety of stations, including smartphones, wearables, smart home devices, IoT devices, other consumer devices, or industrial, scientific, and medical (ISM) devices, among others.

In the embodiment shown, integrated circuit 400 includes a memory system 410 which in an embodiment may include volatile storage, such as RAM and non-volatile memory as a flash memory. The flash memory is a non-transitory storage medium that can store instructions and data. As further shown integrated circuit 400 also may include a memory controller 490.

Memory system 410 couples via a bus 450 to one or more digital cores 420, which may include one or more cores and/or microcontrollers that act as processing units of the integrated circuit. In turn, digital cores 420 may couple to clock generators 430 which may provide one or more phase locked loops or other clock generator circuitry to generate various clocks for use by circuitry of the IC.

As further illustrated, IC 400 further includes power circuitry 440, which may include one or more voltage regulators, including such voltage regulators for PAS and LNAs as described herein. Additional circuitry may be present depending on particular implementation to provide various functionality and interaction with external devices. Such circuitry may include interface circuitry 460 which provides a digital communication interface with additional circuitry (such as a memory, to couple to IC 400 via a link 495. IC 400 also may include security circuitry 470 to perform wireless security techniques.

In addition, as shown in FIG. 4, transceiver circuitry 480 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. As shown, transceiver circuitry 480 includes a transmitter signal processing path 4851 and a receiver signal processing path 4852 having ESD circuitry and an integrated TR switch as described herein. Understand while shown with this high level view, many variations and alternatives are possible.

Figure 5:
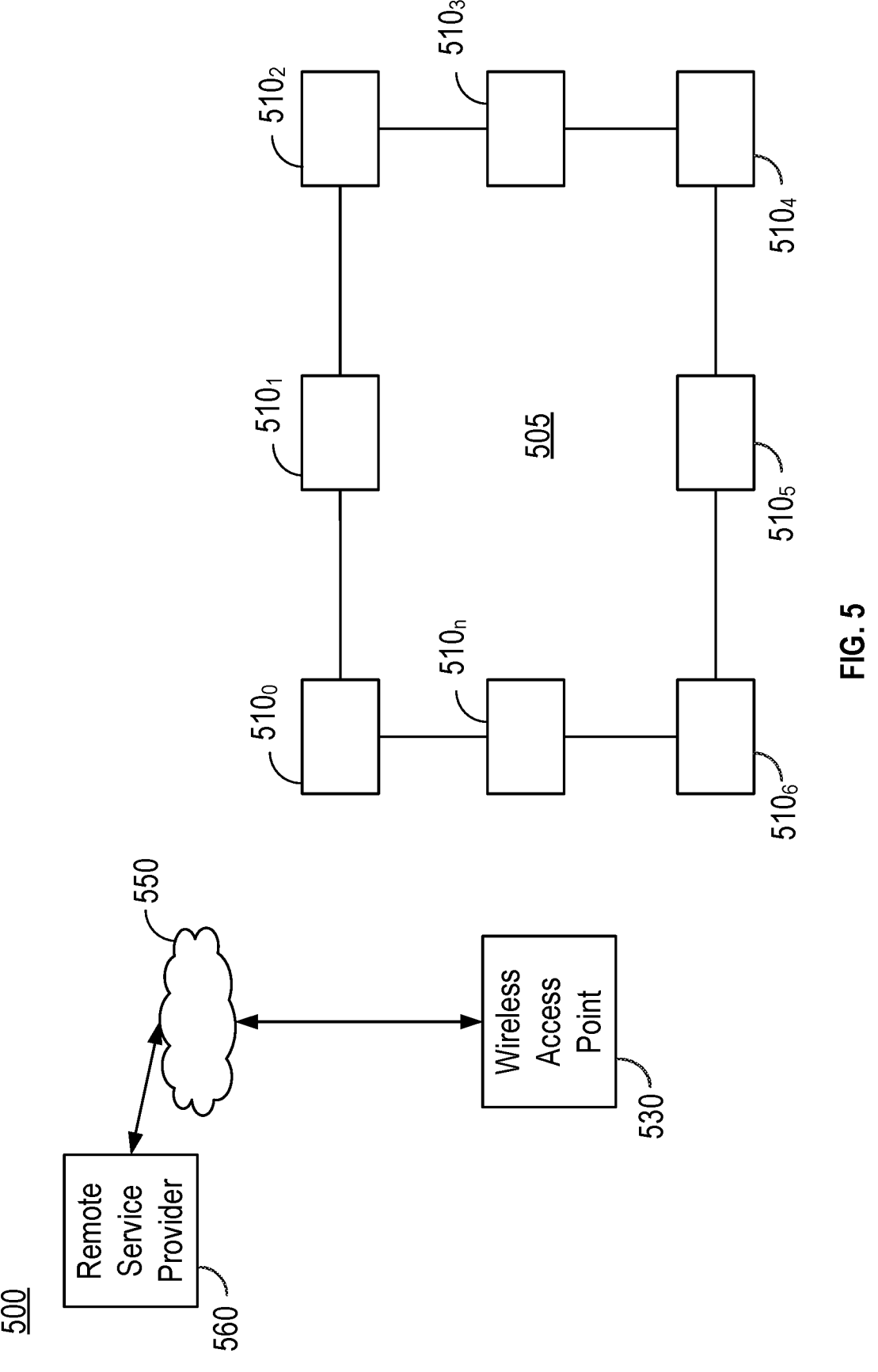
FIG. 5 is a high level diagram of a network in accordance with an embodiment.

ICs such as described herein may be implemented in a variety of different devices such as wireless stations, IoT devices or so forth. Referring now to FIG. 5, shown is a high level diagram of a network in accordance with an embodiment. As shown in FIG. 5, a network 500 includes a variety of devices, including wireless stations including smart devices such as IoT devices, access points and remote service providers, which may leverage embodiments for providing pad attenuator circuitry as described herein.

In the embodiment of FIG. 5, a wireless network 505 is present, e.g., in a building having multiple wireless devices 5100-*n*. As shown, wireless devices 510 couple to an access point 530 that in turn communicates with a remote service provider 560 via a wide area network 550, e.g., the internet. Understand while shown at this high level in the embodiment of FIG. 5, many variations and alternatives are possible.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
   a receiver pad to receive an incoming radio frequency (RF) signal captured by an antenna;
   a first inductor coupled to the receiver pad;
   a second inductor coupled to the first inductor at an inter-inductor node;
   a first electrostatic discharge (ESD) circuit coupled to the inter-inductor node;
   a second ESD circuit coupled to the second inductor;
   a low noise amplifier (LNA) coupled to the second inductor to receive and amplify the incoming RF signal;

a transmit-receive (TR) switch coupled to the LNA, wherein in a receive mode, the TR switch is to enable the LNA to receive the incoming RF signal;
   a transmit pad to output an outgoing RF signal to the antenna; and
   a power amplifier (PA) coupled to the transmit pad, wherein in a transmit mode, the TR switch is to decouple the LNA.

2. The apparatus of claim 1, further comprising a unitary loop structure formed on a semiconductor die, the unitary loop structure comprising the first inductor and the second inductor.

3. The apparatus of claim 2, wherein the first inductor has a greater inductance than the second inductance.

4. The apparatus of claim 3, wherein the receiver pad is to couple to a matching circuit coupled to the semiconductor die, the first inductance and the second inductance to match an inductance of the matching circuit.

5. The apparatus of claim 1, wherein the first ESD circuit comprises:
   a first plurality of diodes coupled between the inter-inductor node and a reference voltage node with a first polarity, the first plurality of diodes series coupled; and
   a second plurality of diodes coupled between the inter-inductor node and the reference voltage node with a second polarity, the second plurality of diodes series coupled, the first plurality of diodes in parallel with the second plurality of diodes.

6. The apparatus of claim 5, wherein the second ESD circuit comprises:
   a third plurality of diodes coupled between the second inductor and the reference voltage node with a first polarity, the third plurality of diodes parallel coupled; and
   a fourth plurality of diodes coupled between the second inductor and the reference voltage node with a second polarity, the fourth plurality of diodes parallel coupled, the third plurality of diodes in parallel with the fourth plurality of diodes.

7. The apparatus of claim 5, wherein when the apparatus is configured in a first wireless device having an external TR switch, at least some of the first plurality of diodes and the second plurality of diodes are configured to be unconnected.

8. The apparatus of claim 7, wherein when the apparatus is configured in the first wireless device having the external TR switch, the first ESD circuit is to couple between the receiver pad and the reference voltage node, and a first conductor that couples the first ESD circuit to the inter-inductor node is disconnected.

9. The apparatus of claim 1, wherein the apparatus is to couple to a first matching circuit via the receiver pad and to a second matching circuit via the transmit pad, the first and second matching circuits to couple directly to a diplexer without an external TR switch therebetween.

10. The apparatus of claim 1, wherein the apparatus is to couple to a matching circuit via the receiver pad and the transmit pad, the matching circuit to couple directly to a diplexer without an external TR switch therebetween.

11. An integrated circuit comprising:
   a semiconductor die comprising:
      a receiver pad to receive an incoming radio frequency (RF) signal captured by an antenna;
      a first inductor coupled to the receiver pad;
      a second inductor coupled to the first inductor at an inter-inductor node;
      a first electrostatic discharge (ESD) circuit coupled to the inter-inductor node;

a second ESD circuit coupled to the second inductor;

a low noise amplifier (LNA) coupled to the second inductor to receive and amplify the incoming RF signal;

a transmit-receive (TR) switch coupled to the LNA, wherein:

when the integrated circuit is implemented in a wireless device having an external TR switch coupled to the integrated circuit, the TR switch is controlled to be in an opened state; and when the integrated circuit is implemented in a wireless device not having an external TR switch coupled to the integrated circuit, the TR switch is controlled be in the opened state during a receive mode in which the LNA is to receive the incoming RF signal and in a closed state during a transmit mode;

a transmit pad to output an outgoing RF signal to the antenna during the transmit mode; and a power amplifier (PA) coupled to the transmit pad to amplify and output the outgoing RF signal to the transmit pad.

12. The integrated circuit of claim 11, wherein when the integrated circuit is implemented in the wireless device having the external TR switch coupled to the integrated circuit, a first conductor that couples the first ESD circuit to the inter-inductor node is disconnected, and a second conductor that couples the first ESD circuit to the receiver pad is connected.

13. The integrated circuit of claim 11, wherein the first ESD circuit comprises:

a first diode stack having a first plurality of series-coupled diodes; and a second diode stack coupled in parallel with the first diode stack, the second diode stack having a second plurality of series-coupled diodes.

14. The integrated circuit of claim 13, wherein:

when the integrated circuit is implemented in the wireless device having the external TR switch coupled to the integrated circuit less than all of the first plurality of series-coupled diodes and less than all of the second plurality of series-coupled diodes are connected; and when the integrated circuit is implemented in the wireless device not having the external TR switch coupled to the integrated circuit, all of the first plurality of series-coupled diodes and all of the second plurality of series-coupled diodes are connected.

15. The integrated circuit of claim 11, wherein when the integrated circuit is implemented in the wireless device having the external TR switch coupled to the integrated circuit, the TR switch is controlled to be in a closed state during a calibration mode.

16. The integrated circuit of claim 11, wherein the second ESD circuit comprises:

a third plurality of diodes coupled between the second inductor and the reference voltage node with a first polarity, the third plurality of diodes parallel coupled; and a fourth plurality of diodes coupled between the second inductor and the reference voltage node with a second polarity, the fourth plurality of diodes parallel coupled, the third plurality of diodes in parallel with the fourth plurality of diodes.

17. The integrated circuit of claim 16, wherein when the integrated circuit is implemented in the wireless device having the external TR switch coupled to the integrated circuit, less than all of the third plurality of diodes and less than all of the fourth plurality of diodes are connected.

18. A system comprising:

an antenna to transmit and receive radio frequency (RF) signals;

a diplexer coupled to the antenna to direct the RF signals of a first band to a first matching circuit and direct the RF signals of a second band to a second matching circuit;

the first matching circuit coupled to the diplexer;

the second matching circuit coupled to the diplexer;

an integrated circuit coupled to the first matching circuit and the second matching circuit, the integrated circuit comprising a plurality of transceivers, wherein a first transceiver of the plurality of transceivers comprises:

a receiver pad, in a receive mode, to receive a first RF signal of the first band;

a first inductor coupled to the receiver pad;

a second inductor coupled to the first inductor at an inter-inductor node;

a first electrostatic discharge (ESD) circuit coupled to the inter-inductor node;

a second ESD circuit coupled to the second inductor;

a low noise amplifier (LNA) coupled to the second inductor to receive and amplify the first RF signal of the first band;

a transmit-receive (TR) switch coupled to the LNA, wherein in the receive mode, the TR switch is to enable the LNA to receive the first RF signal of the first band;

a transmit pad, in a transmit mode, to output a second RF signal of the first band; and a power amplifier (PA) to receive and amplify the second RF signal of the first band, wherein in the transmit mode, the TR switch is to decouple the LNA.

19. The system of claim 18, further comprising an external TR switch coupled to the integrated circuit, wherein the TR switch is controlled to be in an opened state when the external TR switch is coupled to the integrated circuit.

20. The system of claim 18, wherein the integrated circuit comprises a unitary loop structure formed on a semiconductor die, the unitary loop structure comprising the first inductor and the second inductor, wherein the first inductor has a first inductance and the second inductor has a second inductance, the first inductance greater than the second inductance, and the first ESD circuit is coupled to a tap point of the unitary loop structure.

* * * * *